US009888320B2

(12) United States Patent
Roh et al.

(10) Patent No.: US 9,888,320 B2
(45) Date of Patent: Feb. 6, 2018

(54) AUDIO DEVICE AND MULTIMEDIA DEVICE INCLUDING AUDIO DEVICE

(71) Applicant: SAMSUNG ELECTRONICS CO., LTD., Suwon-si (KR)

(72) Inventors: Hyungdong Roh, Yongin-si (KR); Myung-Jin Lee, Hwaseong-si (KR); Yonghee Lee, Yongin-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 0 days.

(21) Appl. No.: 15/172,877

(22) Filed: Jun. 3, 2016

(65) Prior Publication Data

US 2017/0005442 A1 Jan. 5, 2017

(30) Foreign Application Priority Data

Jul. 1, 2015 (KR) ........................ 10-2015-0094138
Oct. 20, 2015 (KR) ........................ 10-2015-0146221

(51) Int. Cl.

| | |
|---|---|
| ***H03G 11/00*** | (2006.01) |
| ***H04R 5/04*** | (2006.01) |
| *H01R 24/58* | (2011.01) |
| *H01R 107/00* | (2006.01) |
| *H04R 1/10* | (2006.01) |
| *H04R 29/00* | (2006.01) |

(52) U.S. Cl.

CPC ............... *H04R 5/04* (2013.01); *H01R 24/58* (2013.01); *H01R 2107/00* (2013.01); *H04R 1/1041* (2013.01); *H04R 29/00* (2013.01); *H04R 2420/03* (2013.01)

(58) Field of Classification Search

CPC .. H01R 13/64; H01R 13/665; H01R 13/6616; H01R 13/6683; H01R 24/58; H01R 2107/00; H04R 1/041; H04R 5/04; H04R 29/00; H04R 2420/03

USPC .......................................................... 381/55

See application file for complete search history.

(56) References Cited

U.S. PATENT DOCUMENTS

| | | | | |
|---|---|---|---|---|
| 8,467,828 | B2 | 6/2013 | Johnson et al. | |
| 8,831,241 | B2 * | 9/2014 | Ma ........................ | H04R 3/007 381/74 |
| 8,948,413 | B2 | 2/2015 | Abe et al. | |
| 9,060,228 | B2 | 6/2015 | Lee et al. | |
| 2011/0150234 | A1 * | 6/2011 | Johnson ............... | H01R 13/703 381/74 |
| 2012/0177243 | A1 | 7/2012 | Lee et al. | |
| 2012/0183160 | A1 | 7/2012 | Abe et al. | |

(Continued)

FOREIGN PATENT DOCUMENTS

KR 10-2007-0091926 A 9/2007

*Primary Examiner* — Hemant Patel
(74) *Attorney, Agent, or Firm* — Sughrue Mion, PLLC

(57) ABSTRACT

Disclosed is an audio device including an audio codec circuit connected to a first channel electrode, a second channel electrode, and a microphone detection electrode, and a jack detection circuit connected to a first channel detection electrode, a ground detection electrode, and the microphone detection electrode, and, in response to voltages of the first channel detection electrode and the ground detection electrode corresponding to a ground voltage, the jack detection circuit detects insertion of a jack, applies the ground voltage to the ground detection electrode, and applies a bias voltage to the microphone detection electrode.

19 Claims, 11 Drawing Sheets

(56) References Cited

U.S. PATENT DOCUMENTS

| | | | |
|---|---|---|---|
| 2013/0148820 A1 | 6/2013 | Sagong et al. | |
| 2013/0236025 A1 | 9/2013 | Ma et al. | |
| 2014/0038460 A1 | 2/2014 | Lee et al. | |
| 2014/0072129 A1 * | 3/2014 | Jung .................. | G06F 13/4068 381/58 |
| 2014/0225632 A1 | 8/2014 | Oh et al. | |
| 2015/0055793 A1 * | 2/2015 | Toda .................. | H04R 25/556 381/74 |
| 2015/0098579 A1 | 4/2015 | Holzmann | |

* cited by examiner

AUDIO DEVICE AND MULTIMEDIA DEVICE INCLUDING AUDIO DEVICE

CROSS-REFERENCE TO RELATED APPLICATIONS

This application claims priority under 35 U.S.C. § 119 from Korean Patent Application No. 10-2015-0146221 filed Oct. 20, 2015 in the Korean Intellectual Property Office, and Korean Patent Application No. 10-2015-0094138 filed Jul. 1, 2015 in the Korean Intellectual Property Office, the contents of which are hereby incorporated by reference in their entireties.

BACKGROUND

Apparatuses and methods consistent with exemplary embodiments relate to an electronic device, and more particularly, to an audio device and a multimedia device including the audio device.

Multimedia devices, such as smart phones, smart pads, and so on, are able to generate and play video data and audio data. Audio data can be played through a speaker, or can be played through a personal playback unit, such as earphone or headphone. A multimedia device generally plays audio data through a speaker when a personal playback unit is not connected thereto, and plays audio data through a personal playback unit when the personal playback unit is connected thereto. For such functions, a multimedia device may include a jack detection circuit for detecting whether a jack of a personal playback unit is inserted into a jack slot. When a jack is coupled with a jack slot or separated from the jack slot, various noises may be generated. Those noises can be inadvertently played through a personal playback unit, thereby inconveniencing a user. Therefore, to enhance the convenience for a user, there is needed a unit or method for preventing inadvertent noises from being generated when a jack is coupled with a jack slot or separated from the jack slot.

SUMMARY

Exemplary embodiments provide an audio device for improving user convenience and a multimedia device including the audio device.

According to an aspect of an exemplary embodiment, there is provided an audio device including: an audio codec circuit connected to a first channel electrode, a second channel electrode, and a microphone detection electrode; and a jack detection circuit connected to a first channel detection electrode, a ground detection electrode, and the microphone detection electrode, and, in response to voltages of the first channel detection electrode and the ground detection electrode corresponding to a ground voltage, the jack detection circuit detects insertion of a jack, applies the ground voltage to the ground detection electrode, and applies a bias voltage to the microphone detection electrode.

The audio device may further include: a ground node to which the ground voltage is applied; and a transistor connected between the microphone detection electrode and the ground node, and configured to operate in response to the bias voltage.

The jack detection circuit may include the transistor.

The audio device may further include: a ground node to which the ground voltage is applied; and a transistor connected between the microphone detection electrode and the ground node, and configured to operate in response to a pulse signal.

The audio device may further include a pulse generation circuit configured to activate the pulse signal in response to the channel detection electrode and the ground detection electrode corresponding to the ground voltage and deactivate the pulse signal after a duty time.

The jack detection circuit may include the transistor.

The jack detection circuit may include: a comparator configured to output a high level if a first channel voltage of the first channel detection electrode is equal to or higher than a first voltage, and to output a low level if the voltage of the first channel voltage is lower than the first voltage; and a first pull-up resistor connected between the first channel detection electrode and a power node to which a power voltage is supplied.

The jack detection circuit may further include: a logical gate circuit configured to perform an OR operation based on an output of the comparator and the voltage of the ground detection electrode; and a second pull-up resistor connected between the ground detection electrode and the power node.

The jack detection circuit may detect the jack in response to an output of the logical gate circuit becoming a low level.

The jack detection circuit may further include: a first transistor configured to connect the microphone detection electrode with a ground node in response to an output of the logical gate circuit being a high level, and to isolate the microphone detection electrode from the ground node in response to the output of the logic gate circuit being a low level.

The jack detection circuit may further include: a bias voltage generation circuit configured to generate a bias voltage and transfer the bias voltage to the microphone detection electrode in response to an output of the logical gate circuit being a low level.

The audio device may further include: a second transistor connected between the ground detection electrode and the ground node and configured to operate in response to the bias voltage.

The audio device may further include: a second transistor connected between the ground detection electrode and the ground node and configured to operate in response to a pulse signal that is generated in response to an output of the logical gate circuit being the high level.

According to an aspect of another exemplary embodiment, there is provided a multimedia device including: an application processor; a random access memory; a storage device; a video codec configured to process video data by control of the application processor; a display configured to display a video signal by control of the video codec; a jack slot into which an external jack is inserted; an audio codec connected to a first channel electrode, a second channel electrode, and a microphone detection electrode in the jack slot and configured to process audio data by control of the application processor; and a jack detection circuit connected to a first channel detection electrode, a ground detection electrode, and the microphone detection electrode in the jack slot, and in response to voltages of the first channel detection electrode and the ground detection electrode corresponding to a ground voltage, the jack detection circuit detects insertion of the external jack into the jack slot, applies the ground voltage to the ground detection electrode, and applies a bias voltage to the microphone detection electrode.

The audio codec and the jack detection circuit may be implemented in one semiconductor package.

The multimedia device may form at least one among a smart phone, a smart pad, a smart television, a smart watch, and a wearable device.

According to an aspect of yet another exemplary embodiment, there is provided an audio device including: a logical gate circuit configured to output a first level signal in response to voltages of a first channel detection electrode and a ground detection electrode in a jack slot being ground voltages, and to output a second level signal in response to at least one among the voltages of the first channel detection electrode and the ground detection electrode in the jack slot not being the ground voltage; a transistor configured to connect the ground detection electrode to a ground node to which the ground voltage is supplied in response to the logical gate circuit outputting the first level signal; and a bias voltage generator configured to generate a bias voltage and apply the bias voltage to a microphone detection electrode in response to the logical gate circuit outputting the first level signal, and to apply the ground voltage to the microphone detection electrode in response to the logical gate circuit outputting the second level signal.

The transistor may be configured to operate in response to the bias voltage.

The audio device may further include a pulse generation circuit configured to generate a pulse signal in response to an output of the logical gate circuit outputting the second level signal.

The jack slot may include a first channel electrode, a second channel electrode and a ground electrode, and the audio device may further include an audio codec circuit configured to output audio signals through the first channel electrode, the second channel electrode, and the ground electrode, and to receive an audio signal through the microphone detection electrode.

According to an aspect of still another exemplary embodiment, there is provided a detection circuit including: an OR logical gate configured to generate a logic signal being one among a high voltage and a low voltage in accordance with a first channel electrode voltage and a ground detection electrode voltage; a first transistor configured to selectively apply a ground signal to a microphone detection electrode in accordance with the logic signal; and a second transistor configured to selectively apply the ground signal to the ground detection electrode in accordance with the logic signal.

The detection circuit may further include a bias voltage generation circuit configured to generate a bias voltage in response to the logic signal being the high voltage, and apply the bias voltage to the microphone detection electrode and a gate of the second electrode.

The detection circuit may further include a pulse generator configured to generate a pulse signal in response to the logic signal being the high voltage, and apply the pulse signal to a gate of the second electrode.

The detection circuit may further include a bias voltage generation circuit configured to generate a bias voltage in response to the logic signal being the high voltage, and apply the bias voltage to the microphone detection electrode.

BRIEF DESCRIPTION OF THE FIGURES

The above and other objects and features will become apparent from the following description taken in conjunction with the accompanying drawings in which.

DETAILED DESCRIPTION OF EXEMPLARY EMBODIMENTS

Figure 1:
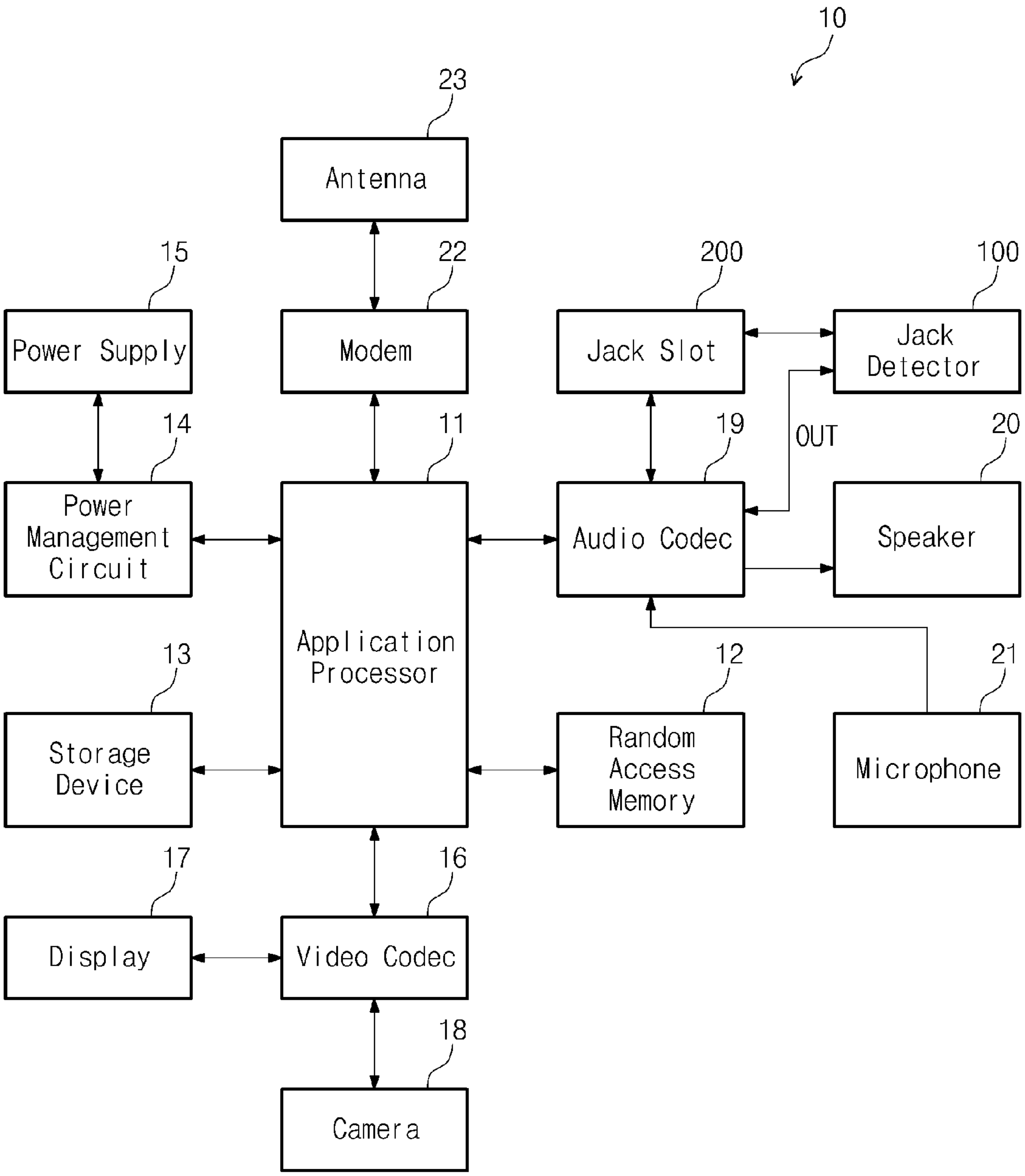
FIG. 1 is a block diagram illustrating a multimedia device according to an exemplary embodiment.

Hereinafter, exemplary embodiments will be described in conjunction with the accompanying drawings. These exemplary embodiments are provided so this disclosure is thorough and complete, and fully conveys the scope of the inventive concept to one skilled in the art. Accordingly, while exemplary embodiments are described herein, the disclosure should be construed as including diverse modifications, equivalents, and/or alternatives. With respect to the descriptions of the drawings, like reference numerals refer to like elements.

The terminology used herein is for the purpose of describing exemplary embodiments only and is not intended to be limiting of the inventive concept. As used herein, the terms “comprises” and/or “comprising,” when used in this specification, specify the presence of stated features, integers, steps, operations, elements, and/or components, but do not preclude the presence or addition of one or more other features, integers, steps, operations, elements, components, and/or groups thereof.

Furthermore, it will be understood that, although the terms “first”, “second”, etc. may be used herein to describe various elements, components, regions, layers and/or sections, these elements, components, regions, layers and/or sections should not be limited by these terms. Thus, a first element, component, region, layer or section discussed below could be termed a second element, component, region, layer or section without departing from the teachings of the inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless explicitly so defined herein. As used herein, the term “and/or” includes any and all combinations of one or more of the associated listed items. Expressions such as “at least one of,” when preceding a list of elements, modify the entire list of elements and do not modify the individual elements of the list.

FIG. 1 is a block diagram illustrating a multimedia device 10 according to an exemplary embodiment. As an example, the multimedia device 10 may be included in a smart phone, a smart pad, a smart television, a tablet computer, a laptop computer, a personal digital assistant (PDA), a portable multimedia player (PMP), a digital camera, a music player, a portable game console, a navigation system, and any wearable device such as a smart watch, a wrist band type electronic device, a necklace type electronic device, a glasses type electronic device, etc. Referring to FIG. 1, the multimedia device 10 may include an application processor 11, a random access memory 12, a storage device 13, a power management circuit 14, a power supply 15, a video codec 16, a display 17, a camera 18, an audio codec 19, a speaker 20, a microphone 21, a modem 22, an antenna 23, a jack detector 100, and a jack slot 200.

The application processor 11 may perform a control function for controlling the multimedia device 10 and may perform an arithmetic function for processing various data. The application processor 11 may execute operating systems and diverse applications.

The random access memory 12 may be used as a main memory unit of the application processor 11. For example, the random access memory 12 may store process codes and various data that are processed by the application processor 11. The random access memory 12 may include a Dynamic Random Access Memory (DRAM), Static RAM (SRAM), Phase-change RAM (PRAM), Magnetic RAM (MRAM), Ferroelectric RAM (FeRAM), or Resistive RAM (RRAM).

The storage device 13 may be used as a secondary memory unit of the application processor 11. For example, the storage device 13 may store source codes of diverse applications or operating systems, or diverse data generated by applications or operating systems for the purpose of long-term storage. The storage device 13 may include a flash memory, PRAM, MRAM, FeRAM, or RRAM.

The power management circuit 14 may distribute or supply power from the power supply 15 to the components of the multimedia device 10. The power management circuit 14 may adjust a quantity of power to be distributed or supplied to components of the multimedia device 10 in accordance with a condition of the multimedia device 10 or an amount of works performed by the multimedia device 10. For example, the power management circuit 14 may control power-saving modes for the multimedia device 10 or the components of the multimedia device 10.

The video codec 16 may generate or play video data. For example, the video codec 16 may encode a signal generated by the camera 18, to generate video data. The video codec 16 may decode video data, which is generated the camera 18, or stored in the storage device 13 or the random access memory 12, and may play the decoded video data through the display 17. The display 17, for example, may include a Liquid Crystal Display (LCD), an Organic Light Emitting Diode (OLED), an Active Matrix OLED (AMOLED), a flexible display, or an electronic ink.

The audio codec 19 may generate or store audio data. For example, the audio codec 19 may encode a signal generated by the microphone 21, to generate audio data. The audio codec 19 may decode audio data, which is generated by the microphone 21 or stored in the storage device 13 or the random access memory 12, and may play the decoded audio data through the speaker 20.

The audio codec 19 may be connected to the jack detector 100 and the jack slot 200. The jack detector 100 may detect whether jack of an external personal playback unit is inserted into the jack slot 200, and may provide a result of the detection as an output signal OUT to the audio codec 19. If an external personal playback unit is inserted into the slot 200, the audio codec 19 may play audio data through the connected personal playback unit.

The jack detector 100 may detect whether an external personal playback unit inserted into the jack slot 200 includes a microphone. If the external personal playback unit includes a microphone, the audio codec 19 may generate audio data based on a signal received from the microphone of the external personal playback unit.

For example, the audio codec 19 and the jack detector 100 may be implemented in one semiconductor package. For example, the jack detector 100 may be included in the audio codec 19.

The modem 22 may communicate with an external device by way of the antenna 23. For example, the modem 22 may communicate with an external device, based on at least one among various wireless communication modes, such as Long Term Evolution (LTE), WiMax, Global System for Mobile (GSM) communication, Code Division Multiple Access (CDMA), Bluetooth, Near Field Communication (NFC), WiFi, Radio Frequency Identification (RFID), and so one, or diverse wired communication modes such as Universal Serial Bus (USB), Serial AT Attachment (SATA), High Speed InterChip (HSIC), Small Computer System Interface (SCSI), Firewire, Peripheral Component Interconnection (PCI), PCI express (PCIe), NonVolatile Memory express (NVMe), Universal Flash Storage (UFS), Secure Digital (SD), SDIO, Universal Asynchronous Receiver Transmitter (UART), Serial Peripheral Interface (SPI), High Speed SPI (HS-SPI), RS232, Inter-Integrated Circuit (I2C), HS-I2C, Integrated-Interchip Sound (I2S), Sony/Philips Digital Interface (S/PDIF), MultiMedia Card (MMC), embedded MMC (eMMC), and so on.

Figure 2:
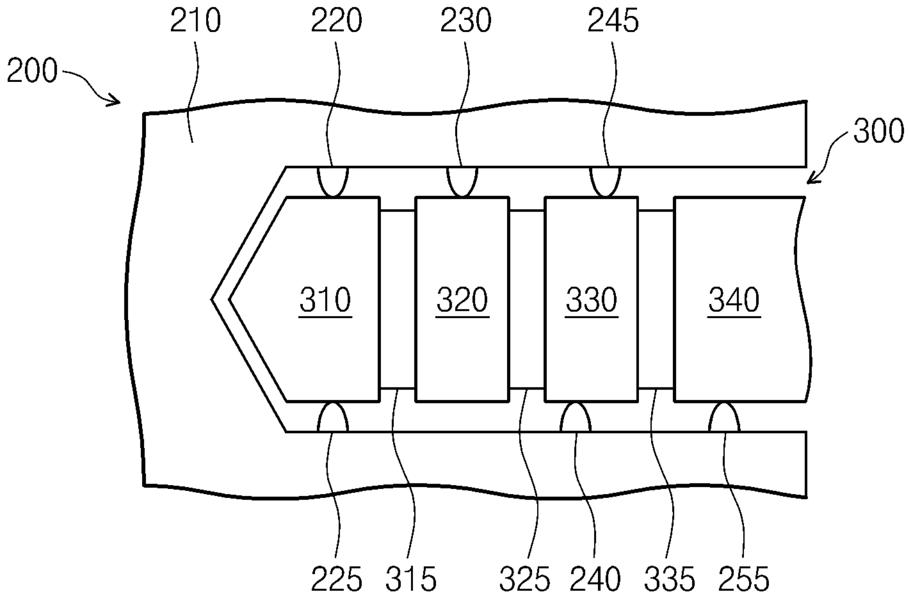
FIGS. 2 and 3 illustrate jacks of external personal playback units inserted into jack slots according to an exemplary embodiment.

FIG. 2 illustrates an example where the jack 300 of an external personal playback unit is inserted into the jack slot 200. For instance, an exemplary insertion feature of a 4-pole jack 300 is shown in FIG. 2.

Referring to FIGS. 1 and 2, the jack slot 200 may include a body 210, a first channel electrode 220, a second channel electrode 230, a ground electrode 240, a first channel detection electrode 225, a ground detection electrode 245, and a microphone detection electrode 255. The body 210 may be formed in, for example, a case, a mold, or a frame of the multimedia device 10.

The first channel electrode 220 and the second channel electrode 230 may be connected to the audio codec 19. When the jack 300 is not coupled with the jack slot 200, the audio codec 19 may apply a power voltage to the first channel electrode 220 and the second channel electrode 230. When the jack 300 is coupled with the jack slot 200, the audio codec 19 may respectively transfer audio signals to the first channel electrode 220 and the second channel electrode 230.

The ground electrode 240 may be connected to the audio codec 19 or the jack detector 100, and may be connected to a ground node of the audio codec 19 or the jack detector 100. The ground node may be a node to which a ground voltage is supplied.

The first channel detection electrode 225 and the ground detection electrode 245 may be connected to the jack detector 100. The jack detector 100 may detect whether the jack 300 is coupled with the jack slot 200, based on voltages of the first channel detection electrode 225 and the ground detection electrode 245.

The microphone detection electrode 255 may be connected to the jack detector 100 and the audio codec 19. When the jack 300 is not coupled with the jack slot 200, the jack detector 100 may transfer the ground voltage to the microphone detection electrode 255. If the jack 300 is detected as being inserted into the jack slot 200, the jack detector 100 may apply a bias voltage to the microphone detection electrode 255, and may thereby detect whether a personal playback unit inserted into the jack slot 200 includes a microphone. Upon determining that the personal playback unit inserted into the jack slot 200 does not include a microphone, the jack detector 100 may apply the ground voltage to the microphone detection electrode 255. Upon determining that the personal playback unit inserted into the jack slot 200 includes a microphone, the jack detector 100 may continuously apply a bias voltage to the microphone detection electrode 255. The audio codec 19 may obtain audio data based on a voltage variation of the microphone detection electrode 255.

For example, the jack 300 inserted into the jack slot 200 may include 4 poles 310, 320, 330 and 340. A first pole 310 may receive an audio signal of the first channel from the first channel electrode 220, i.e., an audio signal of the left channel. A second pole 320 may receive an audio signal from the second channel electrode 230, i.e., an audio signal of the right channel. A third pole 330 may receive the ground voltage from the ground electrode 240. A fourth pole 340 may transfer an audio signal to the codec 19 through the microphone detection electrode 255.

The first pole 310 and the second pole 320 may be electrically isolated from each other through a first insulator 315. The second pole 320 and the third pole 330 may be electrically isolated from each other through a second insulator 325. The third pole 330 and the fourth pole 340 may be electrically isolated from each other through a third insulator 335.

For example, the ground electrode 240 and the ground detection electrode 245 of the jack slot 200 may be unaligned therein. For example, due to processing errors, or according to definitions of a specification, the ground detection electrode 245 and the ground electrode 240 may not be placed on an axis line parallel with the first insulator 315, the second insulator 325, and the third insulator 335.

Figure 3:
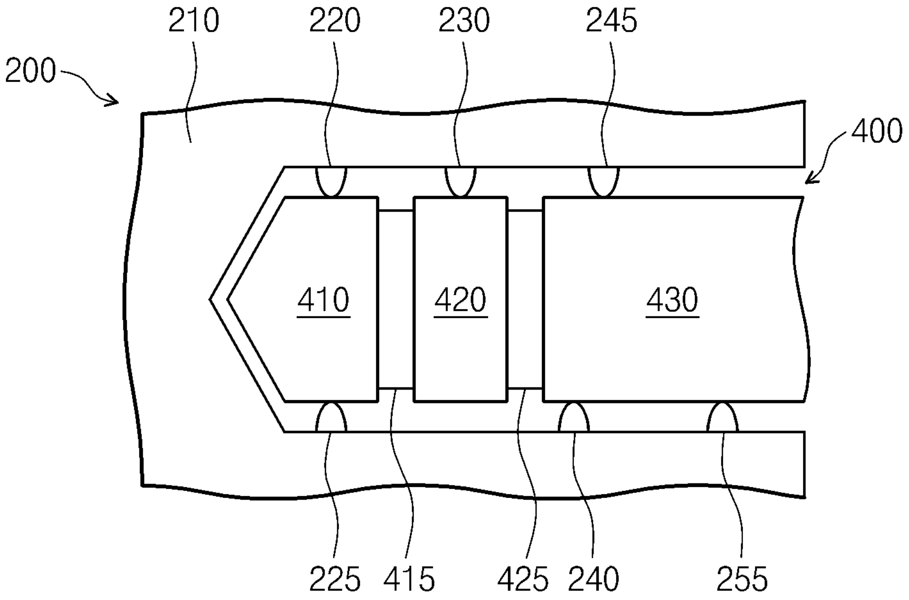

FIG. 3 illustrates an example where a jack 400 of an external personal playback unit is inserted into a jack slot 200. For instance, an exemplary insertion feature of a 3-pole jack 400 is shown in FIG. 3. The jack slot 200 of FIG. 3 has the same structure as the jack slot 200 of FIG. 2. Thus, the jack slot 200 will not be further described in detail.

For example, the jack 400 inserted into the jack slot 200 may include 3 poles 410, 420 and 430. A first pole 410 may receive an audio signal of a first channel from a first channel electrode 220, e.g., an audio signal of the left channel. A second pole 420 may receive an audio signal of a second channel from a second channel electrode 230, e.g., an audio signal of the right channel. A third pole 430 may receive the ground voltage from the ground electrode 240. In comparison with the jack 300 of FIG. 2, the third pole 430 of the jack 400 may extend to a position corresponding to the fourth pole 340 of the jack 300 of FIG. 2. The jack 400 may not have a pole that is allocated to a microphone, and a personal playback unit connected to the jack 400 may not have a microphone.

The first pole 410 and the second pole 420 may be electrically isolated from each other through a first insulator 415. The second pole 420 and the third pole 430 may be electrically from isolated each other through a second insulator 425.

Figure 4:
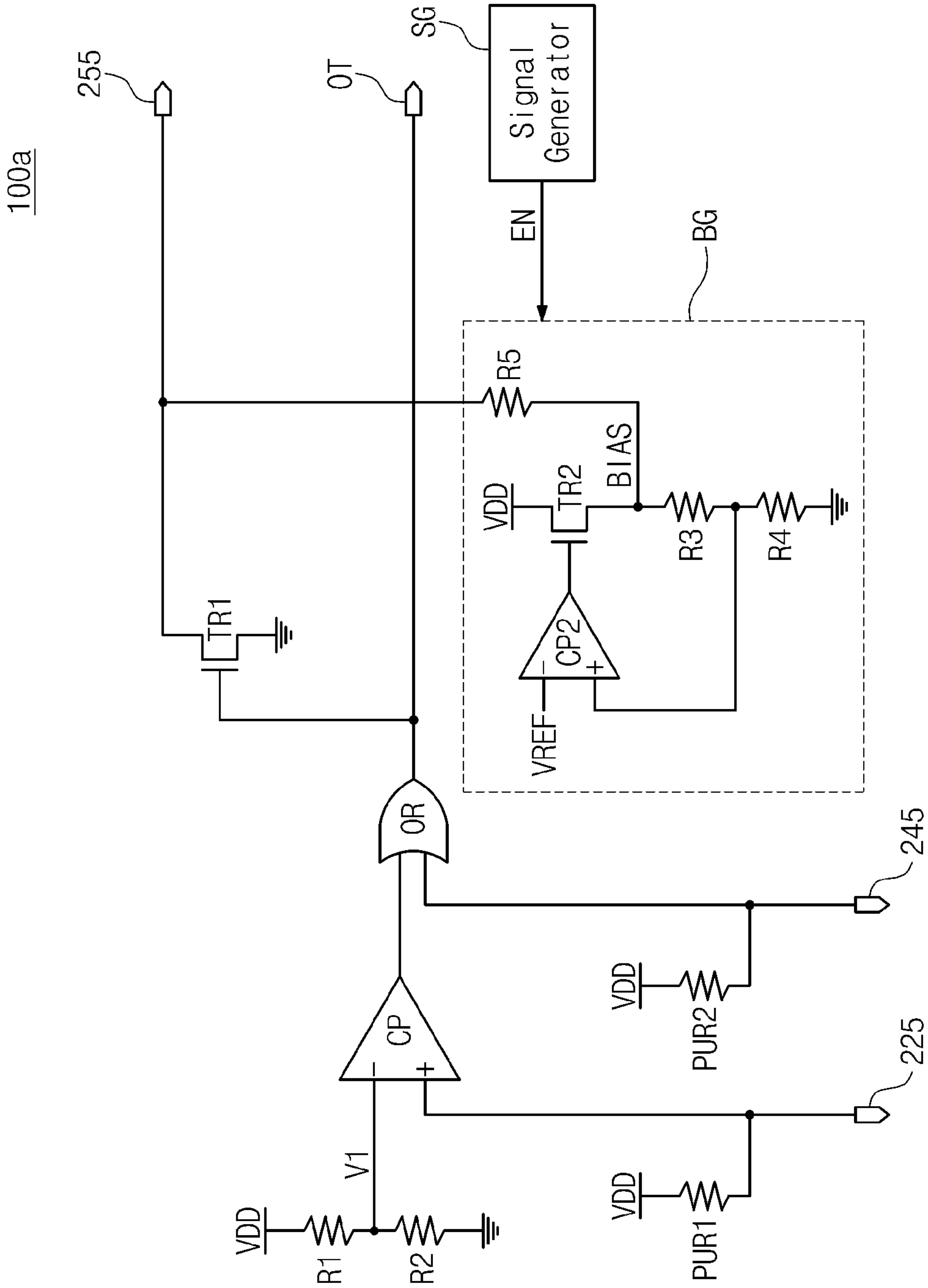
FIG. 4 is a circuit diagram illustrating a jack detector according to an exemplary embodiment.

FIG. 4 is a circuit diagram illustrating 100*a* of a jack detector 100 according to an exemplary embodiment. Referring to FIGS. 2 to 4, the jack detector 100 may include a first resistor R1, a second resistor R2, a comparator CP, a first pull-up resistor PUR1, a logical gate circuit OR, a second pull-up resistor PUR2, a first transistor TR1, a signal generator SG, and a bias voltage generation circuit BG.

The first resistor R1 and the second resistor R2 may be connected in series between a power node, to which a power voltage VDD is supplied, and a ground node to which a ground voltage is supplied. A voltage of a node between the first resistor R1 and the second resistor R2 may be a first voltage V1.

The comparator CP may be formed to compare the first voltage V1 with a voltage of the first channel detection electrode 225. If a voltage of the first channel detection electrode 225 is equal to or higher than the first voltage V1, the comparator CP may output a high level signal. If a voltage of the first channel detection electrode 225 is lower than the first voltage V1, the comparator CP may output a low level signal. An output of the comparator CP may be transferred to the logical gate circuit OR.

The pull-up resistor PUR1 may be connected between a power node and the first channel detection electrode 225. The pull-up resistor PUR1 may transfer the power voltage VDD to the first channel detection electrode 225 and thereby may have a voltage of the first channel detection electrode 225 equal to the power voltage VDD when the jack 300 or 400 is not coupled with the jack slot 200.

The logical gate circuit OR may perform an OR operation with an output of the comparator CP and a voltage of the ground detection electrode 245. An output of the logical gate circuit OR may be transferred as an output signal OUT to the audio codec 19 through an output terminal OT. For example, when an output of the logical gate circuit is at a low level, i.e., when voltages of the first channel detection electrode 225 and the ground detection electrode 245 are on the ground voltage or low voltages similar to the ground voltage, the jack 300 or 400 may be detected as being coupled with the jack slot 200. When an output of the logical gate circuit OR is at a high level, i.e., when at least one among voltages of the first channel detection electrode 225 and the ground detection electrode 245 is on the power voltage or a positive voltage similar to the power voltage, the jack 300 or 400 may be detected as being not coupled with the jack slot 200.

The first transistor TR1 may be connected between the microphone detection electrode 255 and a ground node to which the ground voltage is supplied, and may operate under control of the logical gate circuit OR. When an output of the logical gate circuit OR is at a high level, i.e., when the jack 300 or 400 is not coupled with the jack slot 200, the first transistor TR1 may connect the ground node with the microphone detection electrode 255. That is, the ground voltage may be supplied to the microphone detection node 255. When an output of the logical gate circuit OR is at a low level, i.e., when the jack 300 or 400 is coupled with the jack slot 200, the first transistor TR1 may be turned off. That is, a voltage of the microphone detection electrode 255 may be controlled by the bias voltage generation circuit BG.

The signal generator SG may output an enable signal EN. For example, when an output of the logical gate circuit OR is at a high level, i.e., when the jack 300 or 400 is not coupled with the jack slot 200, the enable signal EN may be inactivated. When an output of the logical gate circuit OR is at a low level, i.e., when the jack 300 or 400 is coupled with the jack slot 200, the enable signal EN may be activated.

When the enable signal EN is activated, the bias voltage generation circuit BG may supply a bias voltage BIAS to the microphone detection electrode 255. When the enable signal EN is inactivated, the bias voltage generation circuit BG may be disabled and may not output the bias voltage BIAS. For example, the bias voltage generation circuit BG may output the ground voltage.

The bias voltage generation circuit BG may include a second comparator CP2, a second transistor TR2, a third resistor R3, a fourth resistor R4, and a fifth resistor R5.

The third resistor R3 and the fourth resistor R4 are connected in series between the second transistor TR2 and a ground node to which the ground voltage is supplied. A node between the third resistor R3 and the fourth resistor R4 may be connected to a positive input terminal of the second comparator CP2. A reference voltage VREF may be applied to a negative input terminal of the second comparator CP2.

The second transistor TR2 may be connected between the third resistor R3 and a power node to which the power voltage VDD is supplied. The second transistor TR2 may be controlled by an output of the second comparator CP2. A voltage of a node between the second transistor TR2 and the third resistor R3 may be the bias voltage BIAS. The bias voltage BIAS may be transferred to the microphone detection electrode 255 through the fifth resistor R5. The bias voltage generation circuit BG may adjust the bias voltage BIAS to equalize a voltage of the node between the third resistor R3 and the fourth resistor R4 with the reference voltage VREF.

Figure 5:
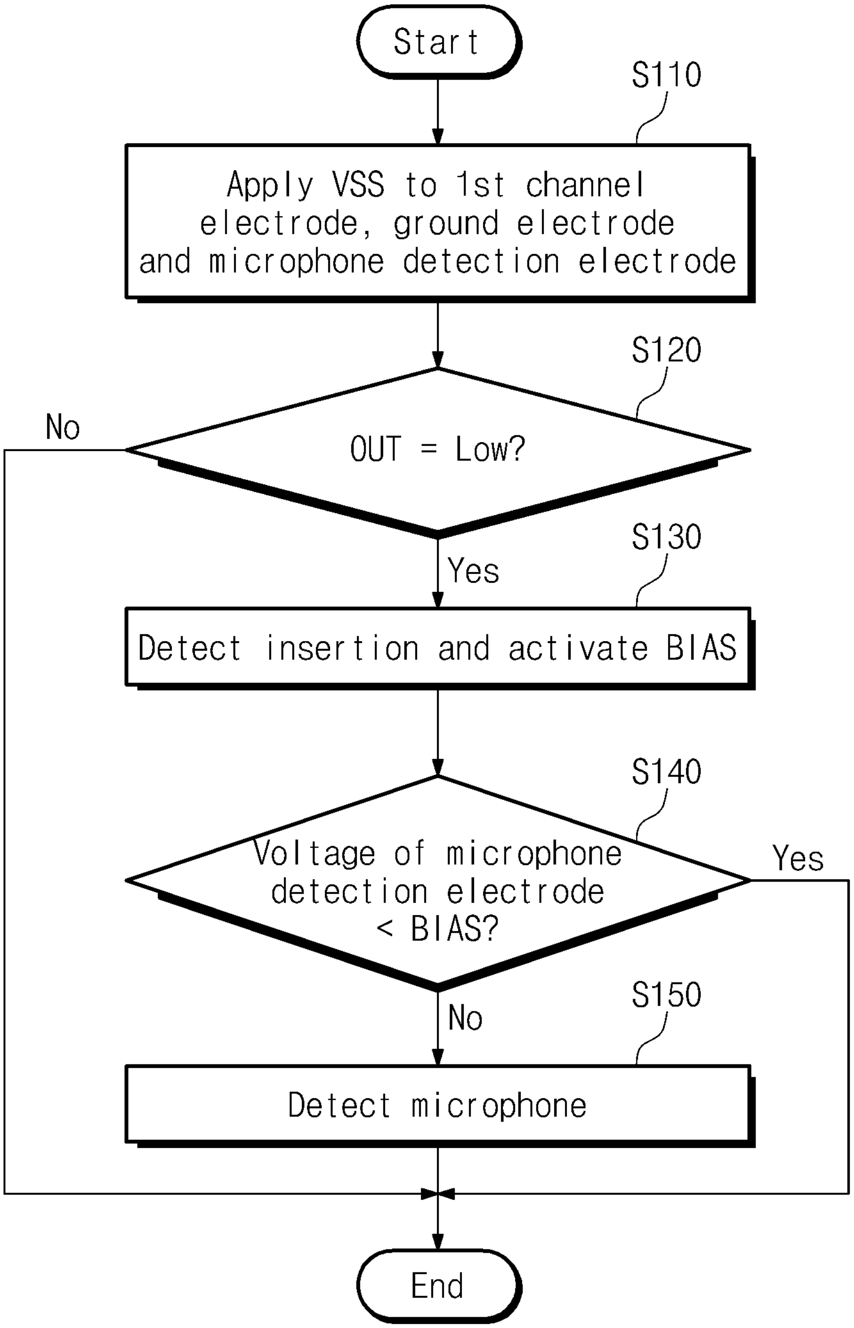
FIG. 5 is a flow chart showing a method of detecting whether a jack is inserted into a jack slot according to an exemplary embodiment.

FIG. 5 is a flow chart showing a method of detecting whether a jack 300 or 400 is inserted into a jack slot 200 according to an exemplary embodiment.

Referring to FIGS. 2 to 5, at step S110, the ground voltage VSS is applied to the first channel electrode 220, the ground electrode 240, and the microphone detection electrode 255. For example, in the condition that the jack 300 is not inserted into the jack slot 200, the audio codec 19 may apply the ground voltage VSS to the first channel electrode 220, the second channel electrode 230, and the ground electrode 240. As an output of the logical gate circuit OR of the jack detector 100 is at a high level in the condition that the jack 300 is not inserted into the jack slot 200, the ground voltage VSS may be supplied to the microphone detection electrode 255 through the first transistor TR1.

At step S120, if the jack 300 is coupled with the jack slot 200, the first channel electrode 220 may be connected to the first channel detection electrode 225 through the first pole 310. Accordingly, a voltage of the first channel detection electrode 225 may decrease to the ground voltage VSS through a ground node of the first channel electrode 220. Additionally, the ground detection electrode 245 may be electrically connected to the ground electrode 240 through the third pole 330. Accordingly, a voltage of the ground detection electrode 245 may decrease to the ground voltage VSS through a ground node of the ground electrode 240. As a result, if the jack 300 is coupled with the jack slot 200, voltages of the first channel detection electrode 225 and the ground detection electrode 245 may decrease to the ground voltage VSS and the output signal OUT may decrease to a low level.

Because the jack 300 is found as not being inserted into the jack slot 200 unless the output signal OUT of the logical gate circuit OR is at a low level, the detecting operation may be terminated. If the output signal OUT of the logical gate circuit OR is at a low level, the jack 300 may be detected as being inserted into the jack slot 200 at step S130. After that, the first transistor TR1 may electrically isolate the microphone detection electrode 255 from the ground node, and the bias voltage generation circuit BG may transfer the bias voltage BIAS to the microphone detection electrode 255.

At step S140, it may be determined that a voltage of the microphone detection electrode 255 is lower than the bias voltage BIAS or a voltage similar to the bias voltage BIAS in level. For example, as illustrated in FIG. 3, in the case that the 3-pole jack 400 is inserted into the jack slot 200, the microphone detection electrode 255 may be connected to the ground electrode through the third pole 430. Accordingly, a voltage of the microphone detection electrode 224 may decrease to a voltage lower than the bias voltage BIAS, i.e., may decrease to the ground voltage VSS, and a personal playback unit therein may be detected as not having a microphone. As illustrated in FIG. 2, in the case that the 4-pole jack 300 is inserted into the jack slot 200, the fourth pole 340 may be connected to a microphone of a personal playback unit. For example, a microphone may have a resistance in the range from 1.35 kΩ to 33 kΩ. A voltage of the microphone detection electrode 255 may become the bias voltage BIAS that is set by dividing a voltage of the node between the third resistor R3 and the second transistor TR2 with the fifth resistor R5 and resistance of a microphone. Accordingly, at step S150, the personal playback unit may be detected as having a microphone.

For example, if a personal playback unit is detected as having a microphone, the bias voltage generation circuit BG may continuously transfer the bias voltage BIAS to the microphone detection electrode 255. The microphone of the personal playback unit may use the bias voltage to obtain an audio signal. An obtained audio signal may be shown in voltage variation of the microphone detection electrode 255.

Figure 6:
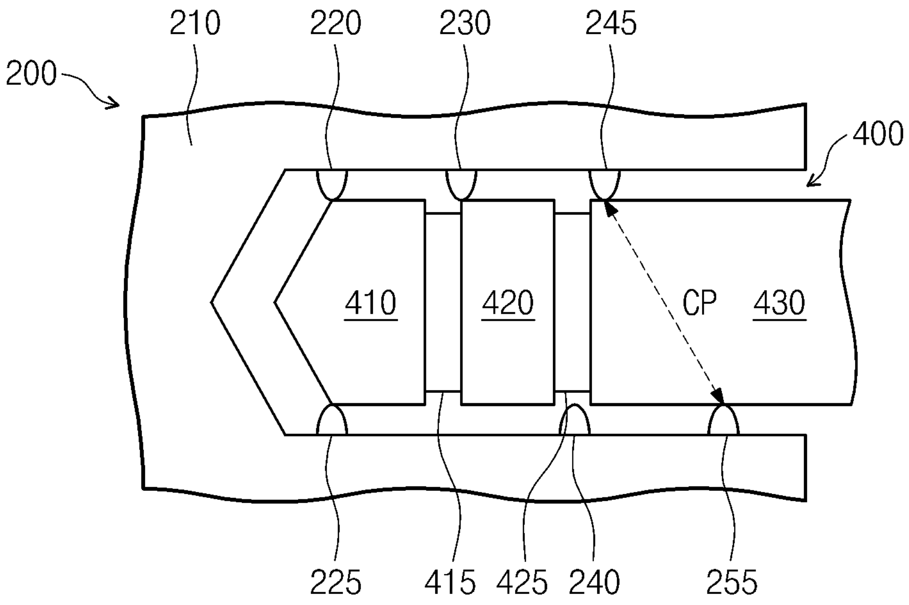
FIG. 6 illustrates a connection of a 3-pole jack inserted into a jack slot or separated from the jack slot according to an exemplary embodiment.

FIG. 6 illustrates a connection state when the 3-pole jack 400 is inserted into the jack slot 200 or separated from the jack slot 200. Referring to FIG. 6, the ground electrode 240 and the ground detection electrode 245 are unaligned therein. Accordingly, the ground electrode 240 may not be electrically connected to the jack 400 at a position aligned to the second insulator 425. The ground detection electrode 245 and the microphone detection electrode 255 may be connected to the third pole 430. In this state, a current path CP may be formed by the third pole 430 between the ground detection electrode 245 and the microphone detection electrode 255, and a voltage of the third pole 430 may be determined by voltages of the ground detection electrode 245 and the microphone detection electrode 255.

Figure 7:
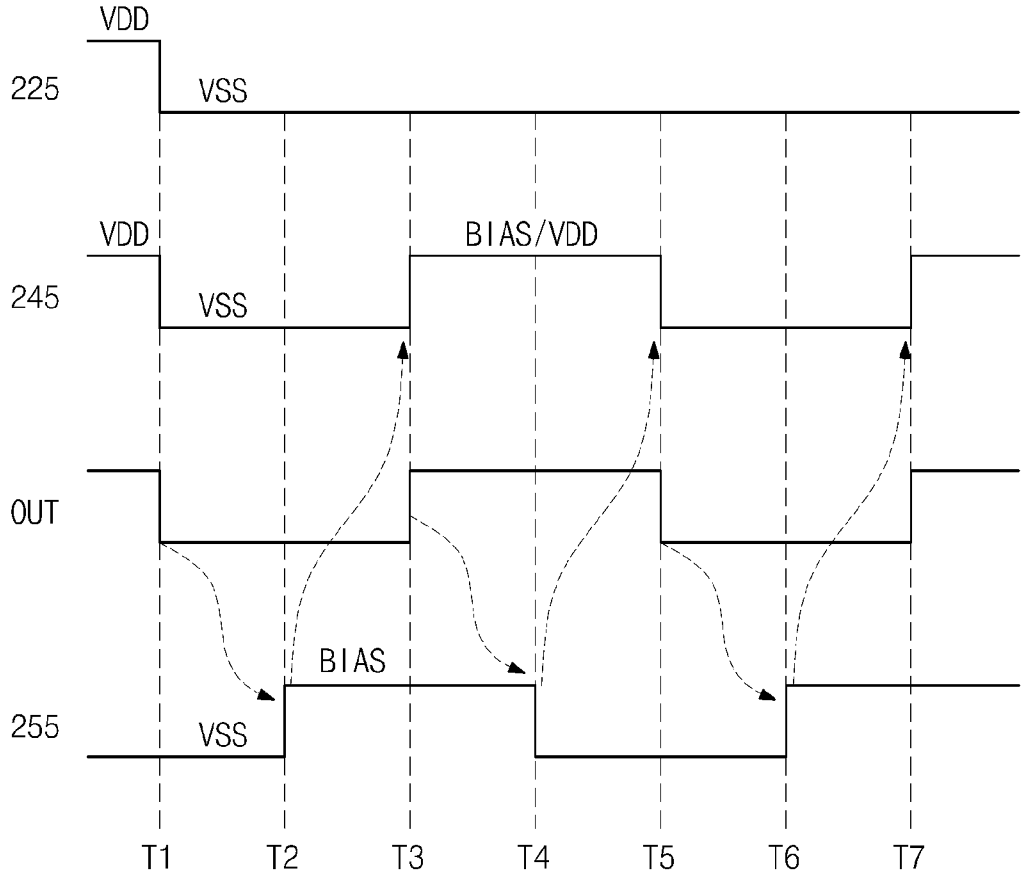
FIG. 7 is a timing diagram showing variations of voltages involved in a jack detector according to an exemplary embodiment.

FIG. 7 is a timing diagram showing variations of voltages involved in the jack detector 100 in the connection state of FIG. 6. Referring to FIGS. 5, 6 and 7, the jack slot 200 and the 3-pole jack 400 may be connected to each other as shown in FIG. 6. The first channel detection electrode 225 may be connected to a power node through the first pull-up resistor PURL Accordingly, a voltage of the first channel detection electrode 225 may be the power voltage VDD when the jack 400 is not inserted into the jack slot 200, as shown before a first timing T1. As illustrated in FIG. 6, if the first channel detection electrode 225 is connected to the first channel electrode 220 through the first pole 410, a voltage of the first channel detection electrode 225 may decrease to the ground voltage VSS as shown at the first timing T1 due to the ground voltage VSS that is supplied to the first channel electrode 220.

The ground detection electrode 245 may be connected to a power node through the second pull-up resistor PUR2.

Accordingly, when the jack 400 is not inserted into the jack slot 200, a voltage of the ground detection electrode 245 may be the power voltage VDD as shown before the first timing T1. As illustrated in FIG. 6, if the ground detection electrode 245 is connected to the microphone detection electrode 255 through the third pole 430, a voltage of the ground detection electrode 245 may decrease to the ground voltage VSS through the first transistor TR1 turned-on, as shown at the first timing T1, due to the ground voltage VSS of the microphone detection electrode 255.

When the jack 400 is not inserted into the jack slot 200, voltages of the first channel detection electrode 225 and the ground detection electrode 245 may become the power voltage VDD or voltages similar to the power voltage VDD. Accordingly, the comparator CP may output the output signal OUT of high level and the logical gate circuit OR may output the output signal OUT of high level as shown before the first timing T1. When the jack 400 is inserted into the jack slot 200, as illustrated in FIG. 6, voltages of the first channel detection electrode 225 and the ground detection electrode 245 may decrease to the ground voltage VSS or voltages similar to the ground voltage VSS. Accordingly, the comparator CP may output a low level signal and the logical gate circuit OR may output the output signal OUT of low level as shown at the first timing T1.

In the condition that the jack 400 is not inserted into the jack slot 200, the output signal OUT may be at a high level, as shown before the first timing T1. Accordingly, the first transistor TR1 may connect a ground node with the microphone detection electrode 255 and a voltage of the microphone detection electrode 255 may become the ground voltage VSS as shown before the first timing T1. If the output signal OUT transitions to a low level from a high level, as shown at the first timing T1, the enable signal EN may be activated. Accordingly, at a second timing T2, the transistor TR1 may be turned off and the bias voltage generation circuit BG may output the bias voltage BIAS. Accordingly, a voltage of the microphone detection electrode 255 may increase from the ground voltage VSS.

If a voltage of the microphone detection electrode 255 increases from the ground voltage VSS at the second timing T2, thereafter, at a third timing T3, a voltage of the ground detection electrode 245 connected to the microphone detection electrode 255 through the third pole 430 may also increase, due to the current path CP. For example, a voltage of the ground detection electrode 245 may increase to the bias voltage BIAS that is supplied from the microphone detection electrode 255, the power voltage VDD that is supplied through the second pull-up resistor PUR2, or an intermediate voltage between the bias voltage BIAS and the power voltage VDD.

If a voltage of the ground detection electrode 245 increases, the output signal OUT of the logical gate circuit OR may transition to a high level from a low level at the third timing T3. If the output signal OUT transitions to a high level, the first transistor TR1 may be turned on and the bias voltage generation circuit BG may be disabled. Accordingly, at a fourth timing T4, a voltage of the microphone detection electrode 255 may decrease to the ground voltage VSS.

As a voltage of the microphone detection electrode 255 decreases to the ground voltage VSS, at a fifth timing T5, a voltage of the ground detection electrode 245 may also decrease to the ground voltage VSS. The output signal OUT of the logical gate circuit OR may transition to a low level from a high level at the fifth timing T5. At a sixth timing T6, the first transistor TR1 may be turned off and the bias voltage generation circuit BG may output the bias voltage BIAS. Accordingly, a voltage of the microphone detection electrode 255 may increase to the bias voltage BIAS from the ground voltage VSS at the sixth timing T6.

As a voltage of the microphone detection electrode 255 increases to the bias voltage BIAS, at a seventh timing T7, a voltage of the ground detection electrode 245 may increase.

As shown in FIG. 7, in a case that the ground detection electrode 245 and the microphone detection electrode 255 are shorted and the ground electrode 240 is floated as shown in FIG. 6, the output signal OUT of the logical gate circuit OR may periodically transition between a high level and a low level. While the output signal OUT is periodically transitioning, a voltage of the third pole 430 may vary accompanying with a variation of the ground detection electrode 245 or the microphone detection electrode 255.

A personal playback unit may play an audio signal of the first channel based on a voltage gap between the first pole 410 and the third pole 430, and may play an audio signal of the second channel based on a voltage gap between the second pole 420 and the third pole 430. As shown in FIG. 7, if a voltage of the third pole 430 varies periodically, interfering noises can be periodically generated and sounded through a personal playback unit.

Thus, exemplary embodiments may apply the ground voltage to the ground detection electrode 245 after detecting insertion of the jack 400.

Figure 8:
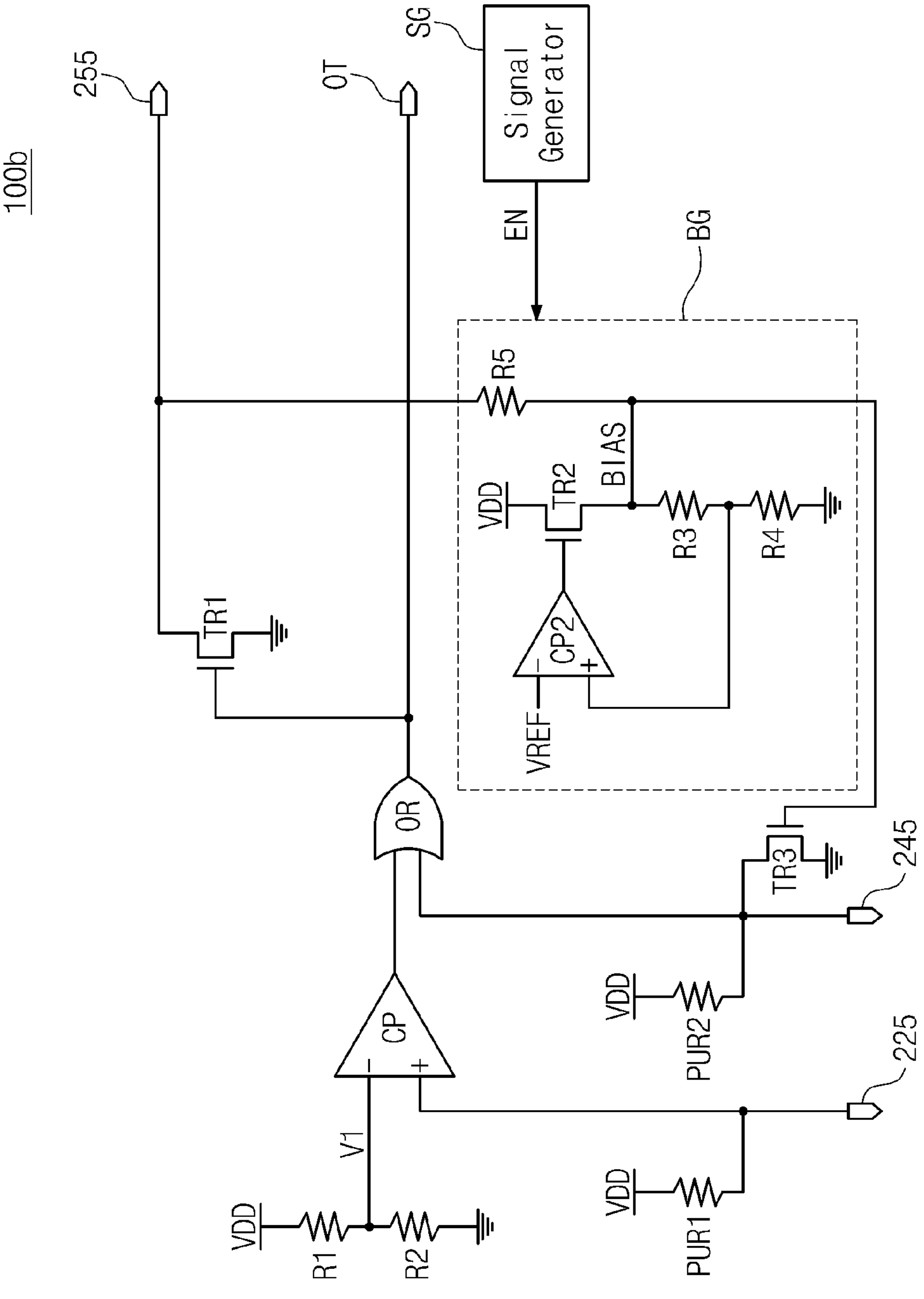
FIG. 8 is a circuit diagram illustrating an application of a jack detector according to an exemplary embodiment.

FIG. 8 is a circuit diagram illustrating an application 100*b* of the jack detector 100 of FIG. 4. Referring to FIG. 8, a jack detector 100*b* may include a first resistor R1, a second resistor R2, a comparator CP, a first pull-up resistor PUR1, a logical gate circuit OR, a second pull-up resistor PUR2, a first transistor TR1, a signal generator SG, a bias voltage generation circuit BG, and a third transistor TR3. In comparison with the jack detector 100 of FIG. 4, the jack detector 100*b* may further include a third transistor TR3. The common elements in the jack detector 100 of FIG. 4 and the jack detector 100*a* of FIG. 8 will not be further described later.

The third transistor TR3 may be connected between the ground detection electrode 245 and a ground node to which the ground voltage is supplied, and may be controlled by a bias voltage BIAS. If the bias voltage generation circuit BG is enabled to output the bias voltage BIAS, the third transistor TR3 may be turned on. Then, the ground node may be connected to a ground detection electrode 245. If the bias voltage generation circuit BG is disabled to output the ground voltage, the third transistor TR3 may be turned off. Then, the ground node may be isolated from a ground detection electrode 245.

Figure 9:
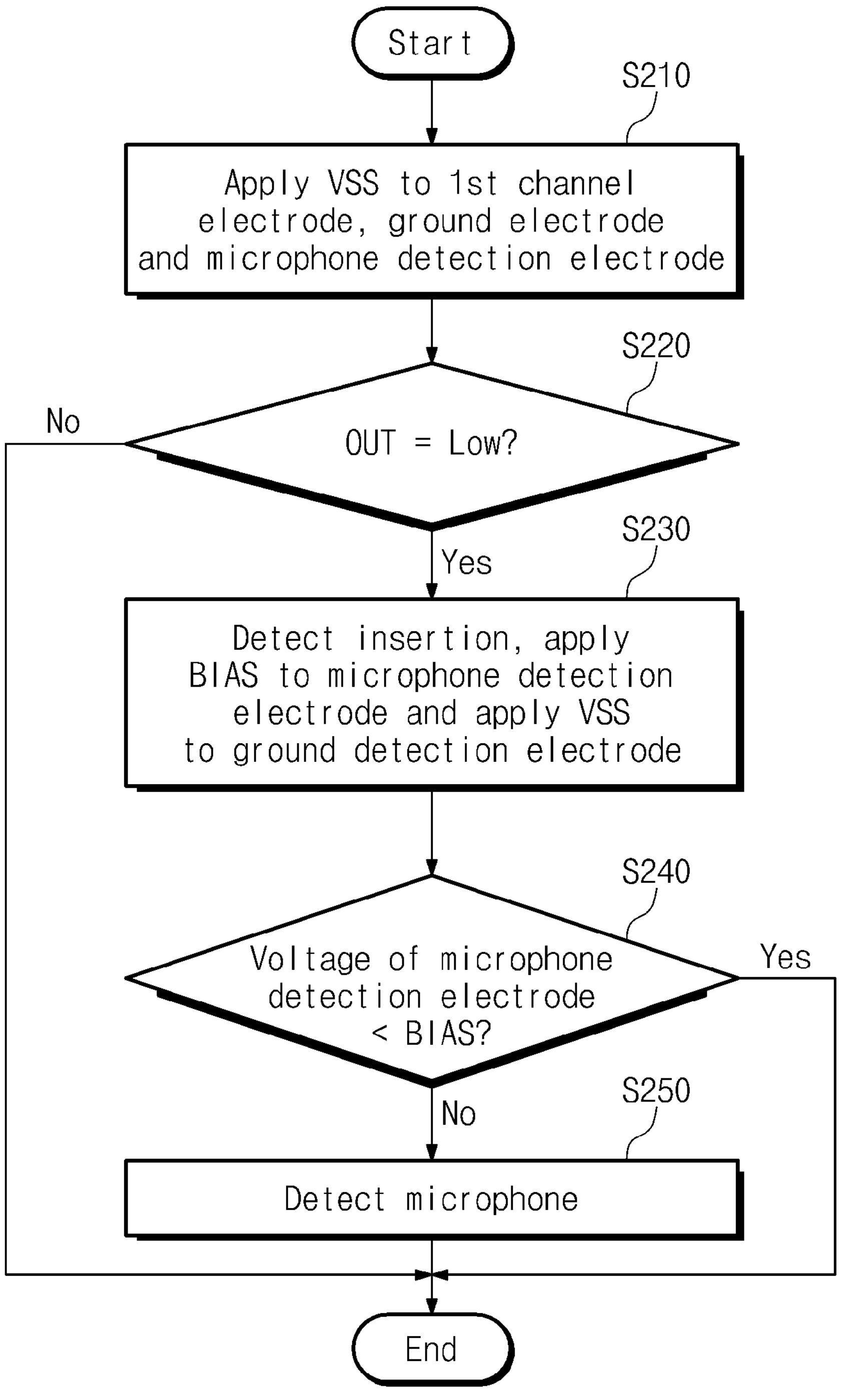
FIG. 9 is a flow chart showing a method of performing jack insertion according to an exemplary embodiment.

FIG. 9 is a flow chart showing a method of performing jack insertion in the jack detector 100*b* of FIG. 8. Referring to FIGS. 8 and 9, at step S210, the ground voltage may be supplied to the first channel electrode 220, the ground electrode 240, and the microphone detection electrode 255. The step S210 may be performed in the same manner with the step S120 of FIG. 5.

At step S220, it may be determined whether the output signal OUT of the logical gate circuit OR is at a low level. The step S220 may be performed in the same manner with the step S220 of FIG. 5.

If the output signal OUT of the logical gate circuit OR is at a high level, jack insertion may not be detected and the process may be terminated. If the output signal OUT of the logical gate circuit OR is at a low level, jack insertion may be detected and step S230 may be performed.

At the step S230, as the jack insertion is detected, the bias voltage BIAS may be applied to the microphone detection electrode 255, and the ground voltage VSS may be applied to the ground detection electrode 245. For example, the bias voltage generation circuit BG may be enabled to apply the bias voltage BIAS to the microphone detection electrode 255. The third transistor TR3 may be turned on by the bias voltage BIAS to transfer the ground voltage VSS to the ground detection electrode 245.

At step S240, it may be determined whether a voltage of the microphone detection electrode 255 is lower than the bias voltage BIAS. The step S240 may be performed in the same manner as the step S140 of FIG. 5.

If a voltage of the microphone detection electrode 255 is lower than the bias voltage BIAS, a microphone may not be detected, and the process may be terminated. If a voltage of the microphone detection electrode 255 is similar to the bias voltage BIAS, a microphone may be detected at step S250. The step S250 may be performed in the same manner with the step S150 of FIG. 5.

Figure 10:
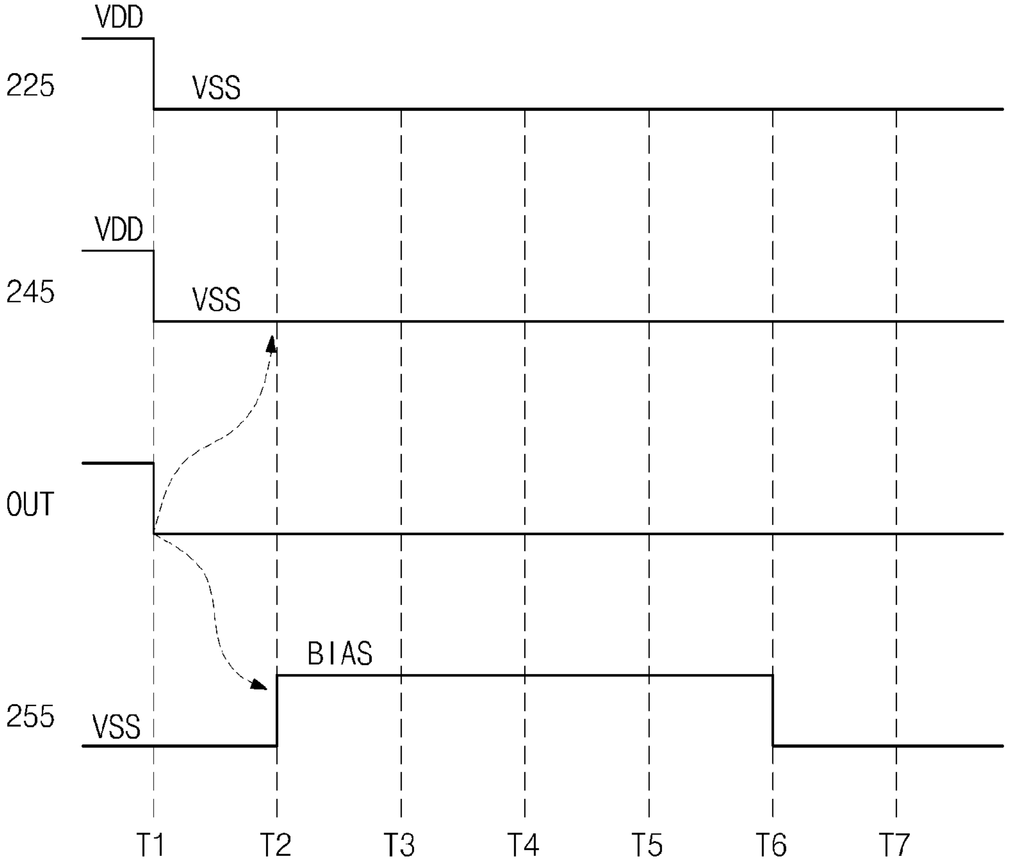
FIG. 10 is a timing diagram showing variations of voltages involved in a jack detector according to an exemplary embodiment.

FIG. 10 is a timing diagram showing variations of voltages involved in the jack detector 100*b* of FIG. 8 in the connection state illustrated in FIG. 6. Referring to FIGS. 6, 8, and 10, at a first timing T1, if the 3-pole jack 400 is coupled with the jack slot 200 as illustrated in FIG. 6, a voltage of the first channel detection electrode 225 may decrease to the ground voltage VSS from the power voltage VDD. A voltage of the ground detection electrode 245 may decrease to the ground voltage VSS from the power voltage VDD. Accordingly, the output signal OUT of the logical gate circuit OR may transition to a low level from a high level. Then, insertion of the jack 400 may be detected.

At a second timing T2, the first transistor TR1 may be turned off and the bias voltage generation circuit BG may output the bias voltage BIAS. Accordingly, a voltage of the microphone detection electrode 255 may increase to the bias voltage BIAS from the ground voltage VSS. Additionally, the third transistor TR3 may be turned on by the bias voltage BIAS and the ground detection electrode 245 may be connected to a ground node. Accordingly, although a voltage of the microphone detection electrode 255 increases to the bias voltage BIAS, a voltage of the ground detection electrode 245 may be retained on the ground voltage VSS.

Then, from a third timing T3 to a seventh timing T7, a voltage of the ground detection electrode 245 may be retained at the ground voltage. Accordingly, as aforementioned in conjunction with FIG. 7, variation of a voltage of the third pole 430 of the jack 400 may be prevented, thereby preventing noise. Therefore, user convenience may be improved.

Figure 11:
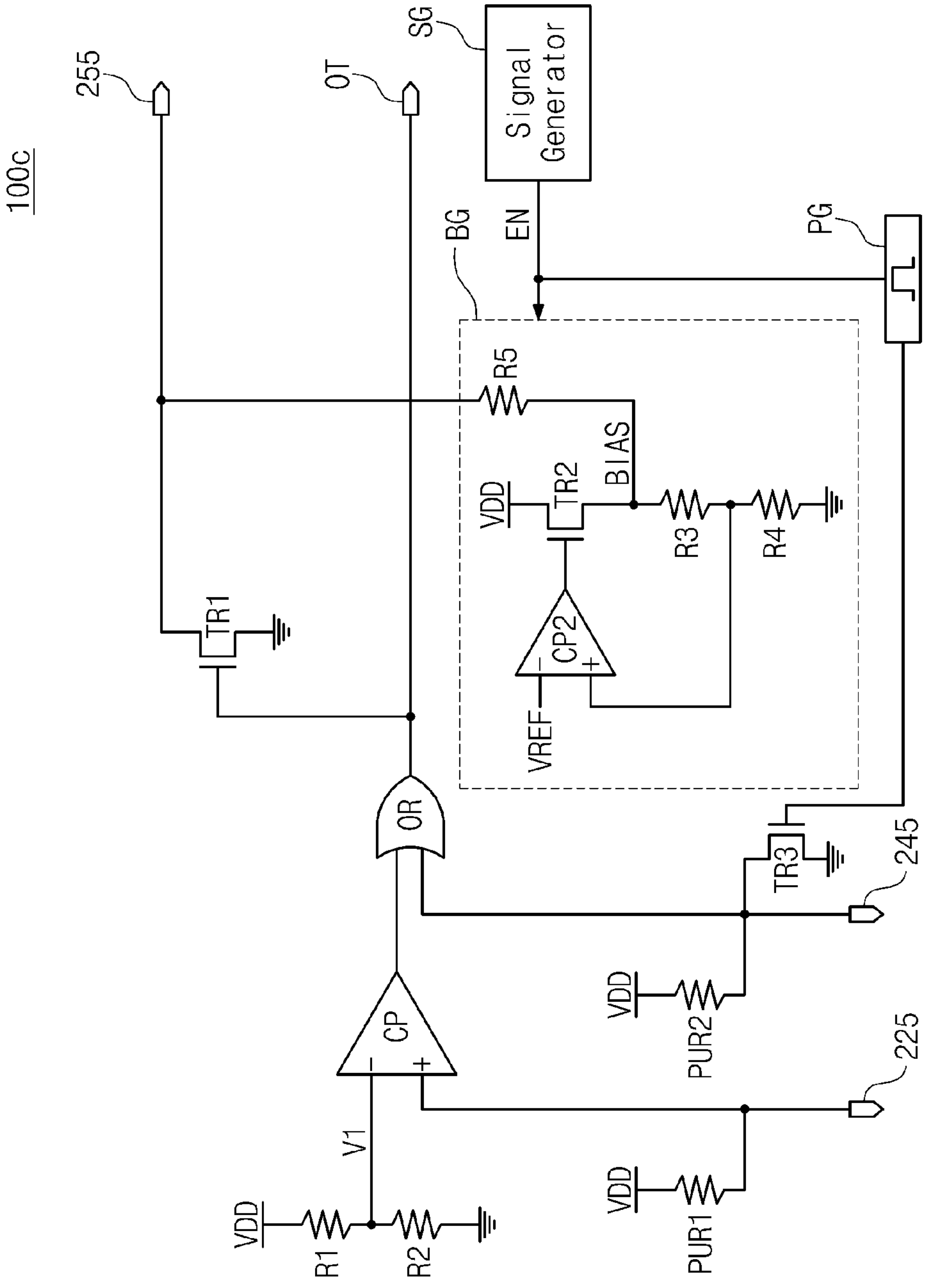
FIG. 11 is a circuit diagram illustrating an application of a jack detector according to an exemplary embodiment.

FIG. 11 is a circuit diagram illustrating an application 100*c* of the jack detector 100*b* of FIG. 8. Referring to FIG. 11, the jack detector 100*c* may include a first resistor R1, a second resistor R2, a comparator CP, a first pull-up resistor PUR1, a logical gate circuit OR, a second pull-up resistor PUR2, a first transistor TR1, a signal generator SG, a bias voltage generation circuit BG, and a third transistor TR3. In comparison with the jack detector 100*b* of FIG. 8, the jack detector 100*c* may further include a pulse generation circuit PG. The third transistor TR3 may be controlled by an output pulse of the pulse generation circuit PG instead of a bias voltage BIAS.

Referring to FIG. 11, the pulse generation circuit PG may be formed to output a pulse signal in response to an enable signal EN. For example, the pulse generation circuit PG may output a pulse signal that transitions to a high level from a low level when the enable signal EN is activated, and transitions to a low level from a high level after a duty time. For example, a duty time may be equal to or longer than a time for detecting whether a personal playback unit includes a microphone. For example, a duty time may be a time for detecting a microphone.

If an output pulse of the pulse generation circuit PG transitions to a high level from a low level, the third transistor TR3 may be turned on. Accordingly, a ground detection electrode 245 may be connected to a ground node, and a voltage of the ground detection electrode 245 from varying along a voltage of a microphone detection electrode 255 may be prevented, similar to the connection state illustrated in FIG. 6. If an output pulse of the pulse generation circuit PG transitions to a low level from a high level after completion of detection for a microphone, the third transistor TR3 may be turned off. Then, the ground detection electrode 245 may be isolated from the ground node and the second pull-up resistor PUR2 connected to the ground detection electrode 245 may be applied thereto. For example, if a jack 400 is separated from a jack slot 200, a voltage of the ground detection electrode 245 may increase to the power voltage VDD by the second pull-up resistor PUR2 and a power node. That is, if the second pull-up resistor PUR2 is applied thereto, the ground detection electrode 245 may detect that the jack 400 is separated from the jack slot 200.

The aforementioned exemplary embodiments are provided to fully explain technical concepts related to a 3-pole jack 400 and a 4-pole jack 300. However, exemplary embodiments are not restricted to the described 3-pole jack 400 and the 4-pole jack 300, and may be extensively applied to an n-pole jack (n is a positive integer).

According to various exemplary embodiments, noise may be prevented from being generated, even if a ground detection electrode is short-circuited with a microphone detection electrode when a jack is coupled with a jack slot or separated from the jack slot.

While various exemplary embodiments have been described, it will be apparent to those skilled in the art that various changes and modifications may be made without departing from the spirit and scope of the inventive concept. Therefore, it should be understood that the above-described exemplary embodiments are not limiting, but illustrative.

What is claimed is:

1. An audio device comprising:

an audio codec circuit connected to a first channel electrode, a second channel electrode, and a microphone detection electrode; and a jack detection circuit connected to a first channel detection electrode, a ground detection electrode, and the microphone detection electrode;

a ground node to which a ground voltage is applied; and a transistor connected between the ground detection electrode and the ground node, wherein, in response to voltages of the first channel detection electrode and the ground detection electrode corresponding to the ground voltage, the jack detection circuit detects insertion of a jack, applies the ground voltage to the ground detection electrode by operating the transistor, and applies a bias voltage to the microphone detection electrode.

2. The audio device of claim 1, wherein the transistor is configured to operate in response to the bias voltage.

3. The audio device of claim 2, wherein the jack detection circuit comprises the transistor.

4. The audio device of claim 1, wherein the transistor is configured to operate in response to a pulse signal.

5. The audio device of claim 4, further comprising a pulse generation circuit configured to activate the pulse signal in response to the first channel detection electrode and the ground detection electrode corresponding to the ground voltage, and deactivate the pulse signal after a duty time.

6. The audio device of claim 4, wherein the jack detection circuit comprises the transistor.

7. The audio device of claim 1, wherein the jack detection circuit comprises:

a comparator configured to output a high level if a first channel voltage of the first channel detection electrode is equal to or higher than a first voltage, and to output a low level if the first channel voltage is lower than the first voltage; and a first pull-up resistor connected between the first channel detection electrode and a power node to which a power voltage is supplied.

8. The audio device of claim 7, wherein the jack detection circuit further comprises:

a logical gate circuit configured to perform an OR operation based on an output of the comparator and the voltage of the ground detection electrode; and a second pull-up resistor connected between the ground detection electrode and the power node.

9. The audio device of claim 8, wherein the jack detection circuit detects the jack in response to an output of the logical gate circuit becoming a low level.

10. The audio device of claim 8, wherein the jack detection circuit further comprises:

a second transistor configured to connect the microphone detection electrode with the ground node in response to an output of the logical gate circuit being a high level, and to isolate the microphone detection electrode from the ground node in response to the output of the logical gate circuit being a low level.

11. The audio device of claim 8, wherein the jack detection circuit further comprises:

a bias voltage generation circuit configured to generate the bias voltage and transfer the bias voltage to the microphone detection electrode in response to an output of the logical gate circuit being a low level.

12. The audio device of claim 11, wherein the transistor is configured to operate in response to a pulse signal that is generated in response to an output of the logical gate circuit being the low level.

13. A multimedia device comprising:

an application processor;

a random access memory;

a storage device;

a video codec configured to process video data by control of the application processor;

a display configured to display a video signal by control of the video codec;

a jack slot into which an external jack is inserted;

an audio codec connected to a first channel electrode, a second channel electrode, and a microphone detection electrode in the jack slot and configured to process audio data by control of the application processor; and a jack detection circuit connected to a first channel detection electrode, a ground detection electrode, and the microphone detection electrode in the jack slot;

a ground node to which a ground voltage is applied; and a transistor connected between the ground detection electrode and the ground node, wherein, in response to voltages of the first channel detection electrode and the ground detection electrode corresponding to the ground voltage, the jack detection circuit detects insertion of the external jack into the jack slot, applies the ground voltage to the ground detection electrode by operating the transistor, and applies a bias voltage to the microphone detection electrode.

14. The multimedia device of claim 13, wherein the audio codec and the jack detection circuit are implemented in one semiconductor package.

15. The multimedia device of claim 13, forming at least one among a smart phone, a smart pad, a smart television, a smart watch, and a wearable device.

16. An audio device comprising:

a logical gate circuit configured to output a first level signal in response to voltages of a first channel detection electrode and a ground detection electrode in a jack slot being ground voltages, and to output a second level signal in response to at least one among the voltages of the first channel detection electrode and the ground detection electrode in the jack slot not being the ground voltage;

a transistor configured to connect the ground detection electrode to a ground node to which the ground voltage is supplied in response to the logical gate circuit outputting the first level signal; and a bias voltage generator configured to generate a bias voltage and apply the bias voltage to a microphone detection electrode in response to the logical gate circuit outputting the first level signal, and to apply the ground voltage to the microphone detection electrode in response to the logical gate circuit outputting the second level signal.

17. The audio device of claim 16, wherein the transistor is configured to operate in response to the bias voltage.

18. The audio device of claim 16, further comprising a pulse generation circuit configured to generate a pulse signal in response to an output of the logical gate circuit outputting the first level signal.

19. The audio device of claim 16, wherein the jack slot comprises a first channel electrode, a second channel electrode and a ground electrode, and the audio device further comprises an audio codec circuit configured to output audio signals through the first channel electrode, the second channel electrode, and the ground electrode, and to receive an audio signal through the microphone detection electrode.

* * * * *